United States Patent [19]

Ohsawa

[11] Patent Number: 5,091,885
[45] Date of Patent: Feb. 25, 1992

[54] DYNAMIC TYPE RANDOM-ACCESS MEMORY HAVING IMPROVED TIMING CHARACTERISTICS

[75] Inventor: Takashi Ohsawa, Yokohama, Japan

[73] Assignee: Kabushiki Kaisha Toshiba, Kawasaki, Japan

[21] Appl. No.: 523,663

[22] Filed: May 15, 1990

[30] Foreign Application Priority Data

May 15, 1989 [JP] Japan ................................. 1-121204

[51] Int. Cl.$^5$ .................. G11C 7/00; G11C 11/41; G11C 11/417; G11C 11/419
[52] U.S. Cl. ................................ 365/203; 365/205; 365/222; 365/233
[58] Field of Search ............ 365/203, 190, 189.01, 365/222, 205, 233

[56] References Cited

U.S. PATENT DOCUMENTS 4,852,064 7/1989 Kim et al. ........................... 365/203
4,933,905 6/1990 Ootani ............................ 365/203 X Primary Examiner—Alyssa H. Bowler
Attorney, Agent, or Firm—Banner, Birch, McKie & Beckett

[57] ABSTRACT

A dynamic type random-access memory includes a bit line pair constituted by first and second bit lines, a memory cell array constituted by a plurality of memory cells ($MC_i$: i=0 to 255) connected to the bit line pair, a precharge circuit for precharging the bit line pair to a predetermined potential at a predetermined timing, a bit line sense amplifier to be enabled after data written in one of the plurality of memory cells ($MC_i$: i=0 to 255) is read out to the bit line pair, and a charge transfer circuit connected between the bit line pair and first and second sense nodes of the bit line sense amplifier, turned off upon reception of a charge transfer drive signal which is decreased from a power source potential to a medium potential between the power source potential and a ground potential when a small potential difference is produced between bit lines of the bit line pair, and having an impedance decreased as a potential difference between the bit line pair and the first and second sense nodes of the bit line sense amplifier is increased when a potential difference between a control terminal and the first and second sense nodes exceeds a threshold value.

6 Claims, 8 Drawing Sheets

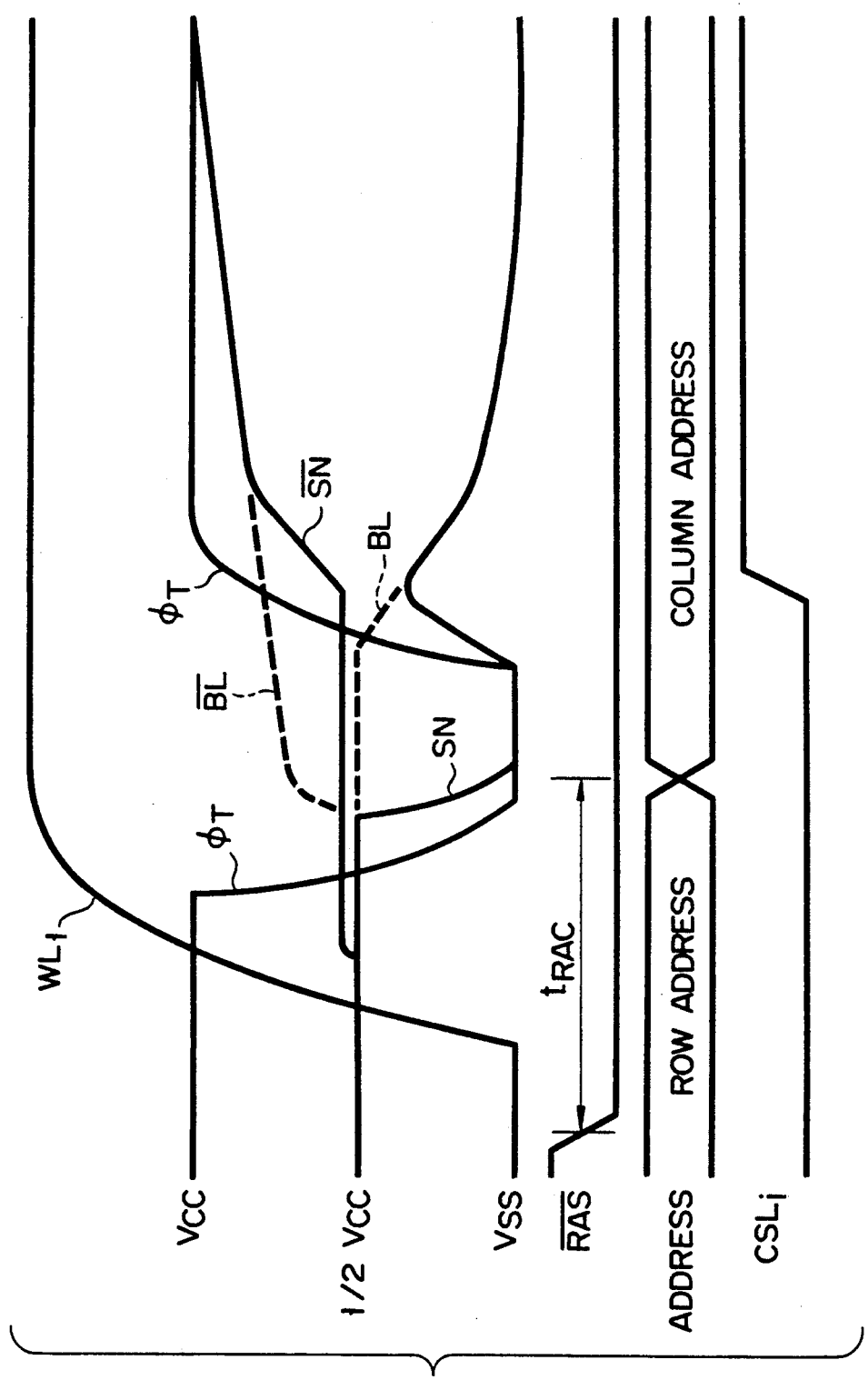
F I G. 2

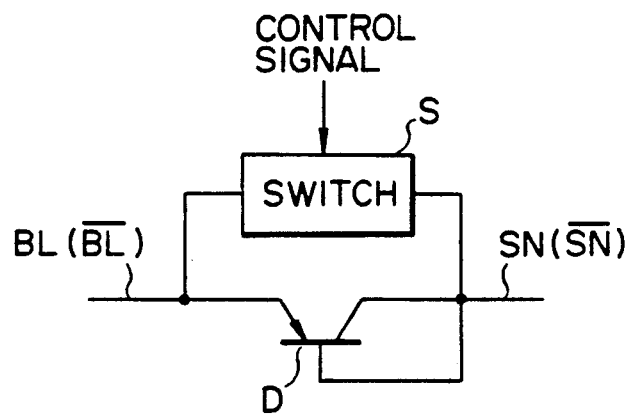
F I G. 13A
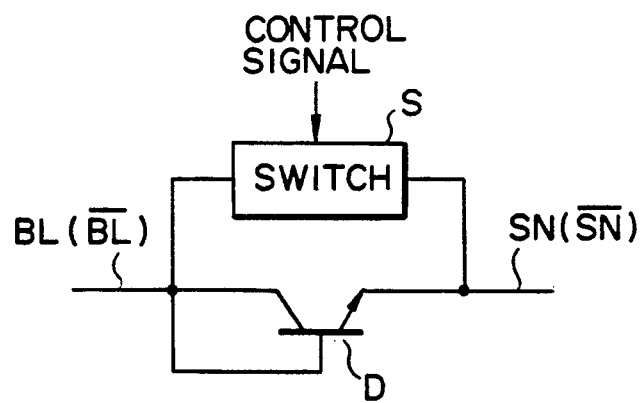
F I G. 13B

DYNAMIC TYPE RANDOM-ACCESS MEMORY HAVING IMPROVED TIMING CHARACTERISTICS

BACKGROUND OF THE INVENTION

1. Field of the Invention

The present invention relates to a dynamic type random-access memory having a charge transfer circuit between a bit line pair and a bit line sense amplifier.

2. Description of the Related Art

In a conventional large-capacity dynamic random-access memory (to be referred to as a DRAM hereinafter), as shown in FIG. 1, charge transfer transistors $NT_1$ and $NT_2$ comprising insulating gate type field effect transistors (MOS transistors) are connected between a pair of bit lines BL and $\overline{BL}$ and a bit line sense amplifier NA of each column so that the bit line sense amplifier can rapidly sense-amplify a potential difference produced in the bit line pair upon reading out of memory cell data.

That is, referring to FIG. 1, reference symbols BL and $\overline{BL}$ denote first and second bit lines constituting a bit line pair of each column in a memory cell array of the DRAM; $MC_i$ (i=0 to 255), a plurality of dynamic memory cells connected to each of the bit lines BL and $\overline{BL}$; $DC_0$ and $DC_1$, dummy cells connected to the first and second bit lines BL and $\overline{BL}$, respectively; $WL_i$ (i=0 to 255), a word line connected to the gate of a charge transfer transistor TM of the memory cell $MC_i$; $DWL_0$ and $DWL_1$, dummy word lines connected to the gates of charge transfer transistors TD of the dummy cells $DC_0$ and $DC_1$, respectively; and $TW_0$ and $TW_1$, dummy cell write transistors for writing dummy cell write voltage $V_{DC}$ in the dummy cells $DC_0$ and $DC_1$, respectively. The transistors $TW_0$ and $TW_1$ are enabled by an equalize signal $\overline{EQL}$. Reference symbol PR denotes a precharge/equalize circuit for precharging and equalizing the bit lines BL and $\overline{BL}$ to a precharge voltage $V_{BL}$ (set to be, e.g., ½ a power source voltage $V_{CC}$). The circuit PR is enabled by an equalize signal $\overline{EQL}$ (bit line precharge dummy cell write signal). Reference symbol PA denotes a bit line restore p-channel sense amplifier in which the drains of two p-channel transistors $P_1$ and $P_2$ having cross-connected gates and drains are connected to the bit lines BL and $\overline{BL}$, respectively, and which is enabled by a p-channel sense amplifier enable signal SAP; and NA, an n-channel sense amplifier in which the drains (a pair of sense nodes SN and $\overline{SN}$) of two n-channel transistors $N_1$ and $N_2$ having cross-connected gates and drains are connected to the other terminals of the charge transfer transistors $NT_1$ and $NT_2$, respectively, and which is enabled by an n-channel sense amplifier enable signal $\overline{SAN}$.

The charge transfer transistors $NT_1$ and $NT_2$ are so controlled as to be kept OFF for a predetermined time period immediately before the n-channel sense amplifier NA is enabled when the gates of the transistors $NT_1$ and $NT_2$ receive a drive signal $\phi_T$ from a charge transfer transistor driver (not shown).

The pair of sense nodes SN and $\overline{SN}$ of the n-channel sense amplifier NA are connected to a pair of column selection transistors $CT_1$ and $CT_2$, respectively. The pair of column selection transistors $CT_1$ and $CT_2$ are connected to a pair of data buses $DL_1$ and $DL_2$ via a pair of data lines $DQ_1$ and $DQ_2$ connected in common to a plurality of columns, respectively, and a data buffer DQB.

A conventional operation of the DRAM having the above arrangement will be described below with reference to waveforms shown in FIG. 2. Assuming that data indicating a potential of 0 V ("L" level) is written in a memory cell $MC_1$ connected to one bit line of the bit line pair, e.g., the bit line BL, read and rewrite operations performed for the memory cell $MC_1$ will be described.

Since this DRAM has a $V_{CC}$ potential of, e.g., 5 V and adopts a driving system for precharging the bit line pair to a voltage of $V_{BL}=V_{CC}/2$, the first and second bit lines BL and $\overline{BL}$ are equally kept at $V_{CC}/2$ before a word line is selected. Row and column addresses are sequentially input as address inputs, and a row address strobe signal $\overline{RAS}$ is enabled after the row address is input, thereby decoding the row address. A word line $WL_1$ at the bit line BL side is selected to turn on the charge transfer transistor TM of the selected memory cell $MC_1$, and the data of 0 V ("L" level) is read out from a capacitor $C_1$ of the memory cell $MC_1$. Therefore, a potential of the first bit line BL is slightly reduced from $V_{CC}/2$.

At the same time the word line $WL_1$ at the first bit line BL side is selected, the dummy word line $DWL_0$ at the second bit line $\overline{BL}$ side is selected to turn on the charge transfer transistor TD of the dummy cell $DC_0$. In this case, a potential of $V_{DC}$ (e.g., $V_{CC}/2$) is prewritten in the dummy cell $DC_0$. Therefore, even if the charge transfer transistor TD is turned on to short-circuit a capacitor $C_0$ and the second bit line $\overline{BL}$, a potential of the second bit line $\overline{BL}$ is kept at $V_{CC}/2$ because the capacitor $C_0$ and the second bit line $\overline{BL}$ are at the same potential.

Thereafter, when a small potential difference is produced between the potentials of the first and second bit lines BL and $\overline{BL}$, the signal $\phi_T$ goes to a potential $V_{SS}$, the charge transfer transistors $NT_1$ and $NT_2$ are turned off, and the bit lines BL and $\overline{BL}$ are disconnected from the bit line sense amplifier NA. A signal $\overline{SAN}$ goes to the ground potential $V_{SS}$ to enable the n-channel sense amplifier NA, and a signal SAP goes to the potential $V_{CC}$ to enable the p-channel sense amplifier PA. As a result, a small potential difference between the pair of sense nodes SN and $\overline{SN}$ of the sense amplifier NA is sense-amplified, and a potential of the sense node SN is reduced to 0 V.

In addition, the potential of the bit line $\overline{BL}$ is increased to the potential $V_{CC}$ side by the p-channel sense amplifier PA. Thereafter, a column address strobe signal $\overline{CAS}$ is enabled to decode the column address, and the pair of column selection transistors $CT_1$ and $CT_2$ are turned on by a column decode signal $CSL_i$. When the transistors $CT_1$ and $CT_2$ are turned on, the potentials of the sense nodes SN and $\overline{SN}$ of the sense amplifier NA are reamplified by the data buffer DQB and output to the pair of data buses $DL_1$ and $DL_2$ via the pair of data lines $DQ_1$ and $DQ_2$, respectively. When the signal $\phi_T$ returns to the potential $V_{CC}$ to turn on the charge transfer transistors $NT_1$ and $NT_2$, the bit lines BL and $\overline{BL}$ are connected to the sense nodes SN and $\overline{SN}$ of the bit line sense amplifier NA. The potential of the first bit line BL is reduced to 0 V, and that of the second sense node $\overline{SN}$ is increased to the potential $V_{CC}$ (e.g., 5 V). Therefore, data of "L" level and that of "H" level are rewritten in the selection memory cell $MC_1$ and the dummy cell $DC_0$, respectively. Thereafter, the word line $WL_1$ and the dummy word line $DWL_0$ return to a nonselection state.

After the above rewrite operation is completed, the bit line precharge dummy cell write signal $\overline{EQL}$ goes to the potential $V_{CC}$, the bit line BL and $\overline{BL}$ are precharged to the voltage $V_{BL}$, and the dummy cells $DC_0$ and $DC_1$ are precharged to the voltage $V_{DC}$.

In the above DRAM, since the capacitances of the bit lines BL and $\overline{BL}$ are completely disconnected from the pair of sense nodes SN and $\overline{SN}$ during an operation of the sense amplifier NA, loads on the sense nodes SN and $\overline{SN}$ are reduced to increase a speed of sense amplification. Therefore, an access time $t_{ACC}$ from a fall timing of the signal RAS to an output timing of readout data can be shortened.

In the above operation of the DRAM, however, when the charge transfer transistors $NT_1$ and $NT_2$ return from an OFF to ON state, a large amount of charges simultaneously flow from the first bit line BL to be reduced to the "L" level side to the sense node SN of the sense amplifier NA, and the potential of the sense node SN is abruptly increased. In this state, a current driving power of the sense amplifier NA is reduced. Therefore, if the column selection transistors $CT_1$ and $CT_2$ are turned on in this state, a speed of extracting charges from the data line $DQ_1$ (precharged to, e.g., the potential $V_{CC}$) connected to the sense node SN may be decreased to disable reamplification in the data buffer DQB.

That is, if a time $t_{RAD}$ from an enable timing (in this case, a fall timing) of the signal $\overline{RAS}$ to an input timing of a column address is shorter or longer than a predetermined range, the potential of the sense node SN of the sense amplifier NA has almost no increase when the column selection transistors $CT_1$ and $CT_2$ are turned on after the column address is input. Therefore, reamplification can be correctly performed in the data buffer DQB.

If, however, the time $t_{RAD}$ from the enable timing of the signal $\overline{RAS}$ to the input timing of the column address falls within the predetermined range, the potential of the sense node SN of the sense amplifier is increased as described above when the column selection transistors $CT_1$ and $CT_2$ are turned on after the column address is input. Therefore, reamplification cannot be correctly performed in the data buffer DQB to cause a read error.

In the DRAM having the above arrangement, therefore, a read error is caused when the time $t_{RAD}$ from the enable timing of the signal $\overline{RAS}$ to the input timing of the column address falls within a predetermined range.

SUMMARY OF THE INVENTION

It is an object of the present invention to provide a dynamic type random-access memory in which a short access time $t_{ACC}$ is maintained and no read error is caused even when the time $t_{RAD}$ from an enable timing of the signal $\overline{RAS}$ to an input timing of a column address is shorter or longer than or falls within a predetermined range.

According to the present invention, there is provided a dynamic type random-access memory, comprising:
- a bit line pair constituted by first and second bit lines;
- a memory cell array constituted by a plurality of memory cells connected to the bit line pair;
- a precharge circuit for precharging the bit line pair to a predetermined potential at a predetermined timing;
- a bit line sense amplifier to be enabled after data written in one of the plurality of memory cells is read out to the bit line pair; and
- a charge transfer circuit connected between the bit line pair and first and second sense nodes of the bit line sense amplifier, turned off upon reception of a charge transfer drive signal which is decreased from a power source potential to a medium potential between the power source potential and a ground potential when a small potential difference is produced between bit lines of the bit line pair, and having an impedance decreased as a potential difference between the bit line pair and the first and second sense nodes of the bit line sense amplifier is increased when a potential difference between a control terminal and the first and second sense nodes exceeds a threshold value.

When read and rewrite operations are to be performed for a memory cell which is connected to the first bit line and in which a potential of 0 V is written, for example, both the first and second bit lines are equally kept at a bit line precharge voltage from an enable timing of a signal $\overline{RAS}$ to a selection timing of a specific word line. When the word line is selected, 0 V of the selected memory cell is read out, and the potential of the first bit line is slightly decreased from the precharge voltage. When a small potential difference is produced between the potentials of the first and second lines in this manner, the charge transfer circuit is turned off, and the bit line pair is disconnected from the bit line sense amplifier. The bit line sense amplifier is enabled to sense-amplify the small potential difference between the potentials of the first and second bit lines, and the potential of the first sense node is decreased to 0 V.

In this case, if a potential difference between the first sense node and the third node of the charge transfer circuit becomes larger than a threshold value of the charge transfer circuit, an impedance of the charge transfer circuit is gradually decreased in accordance with the potential difference between the two terminals, and the potential of the first bit line is gradually decreased to 0 V. Therefore, a large amount of charges do not simultaneously flow from the first bit line to the first sense node, and the potential of the first sense node is not abruptly increased. After the potential of the first bit line is rewritten in the selected memory cell the word line is returned to a nonselection state. Note that the charge transfer circuit is returned to an ON state before or after the rewrite operation is finished. In addition, a bit line precharge signal is enabled to precharge the bit line pair.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a timing chart showing waveforms for explaining an operation of the conventional dynamic type random-access memory shown in FIG. 1;

FIGS. 13A and 13B are circuit diagrams showing modifications of a charge transfer circuit.

DETAILED DESCRIPTION OF THE PREFERRED EMBODIMENTS

An embodiment of the present invention will be described below with reference to the accompanying drawings.

Figure 1:
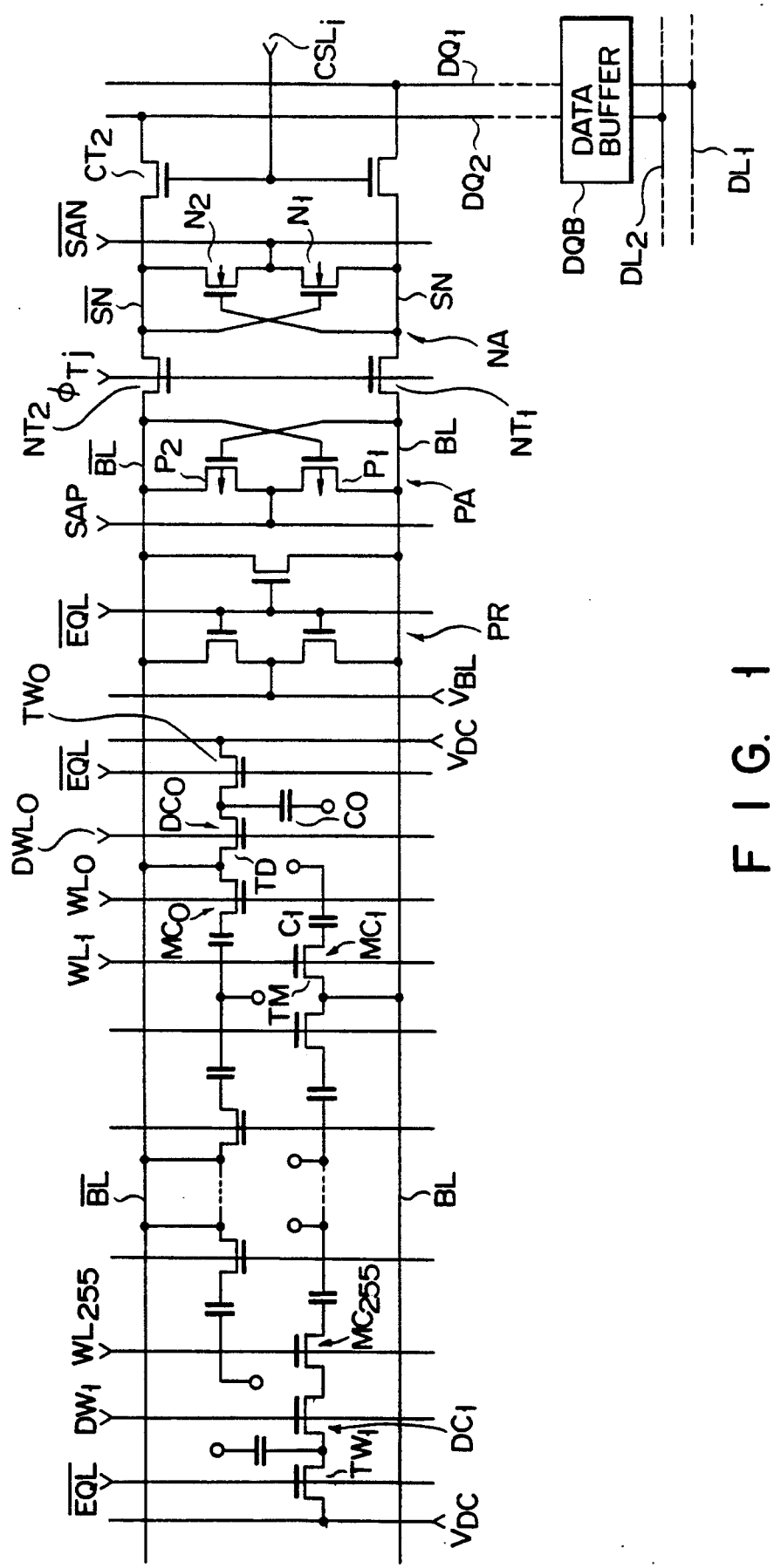
FIG. 1 is a circuit diagram for explaining operations of a conventional dynamic type random-access memory and a dynamic type random-access memory according to the present invention.
Figure 3:
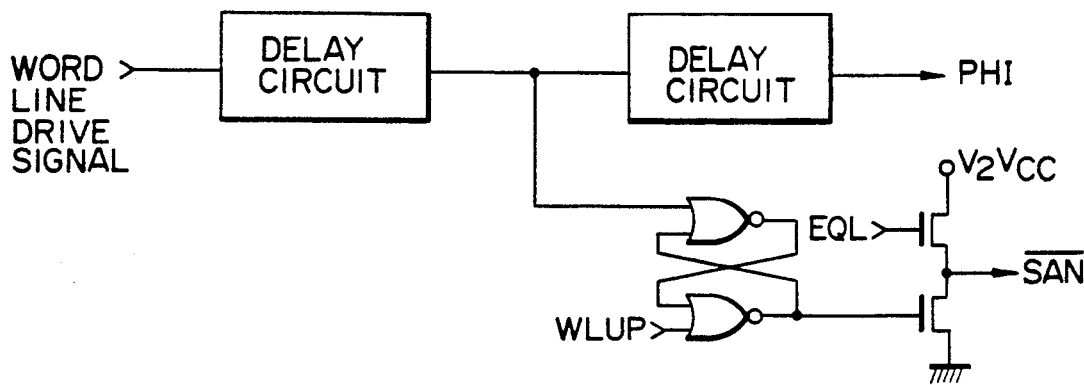
FIGS. 3 and 4 are circuit diagrams showing a circuit for generating an n-channel sense amplifier enable signal $\overline{SAN}$.
Figure 4:
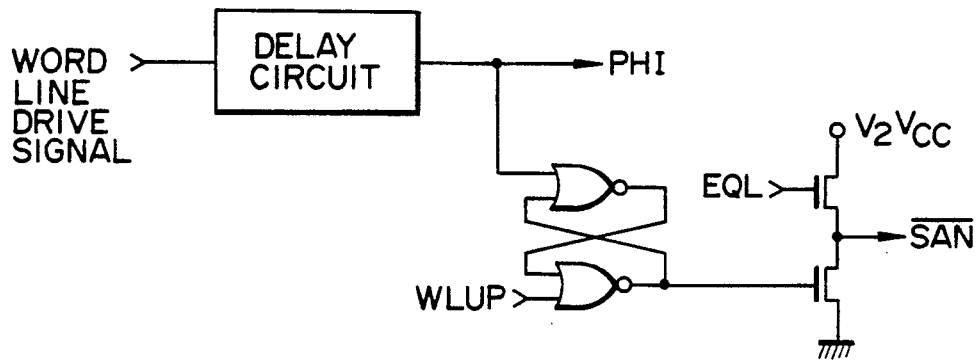
Figure 5:
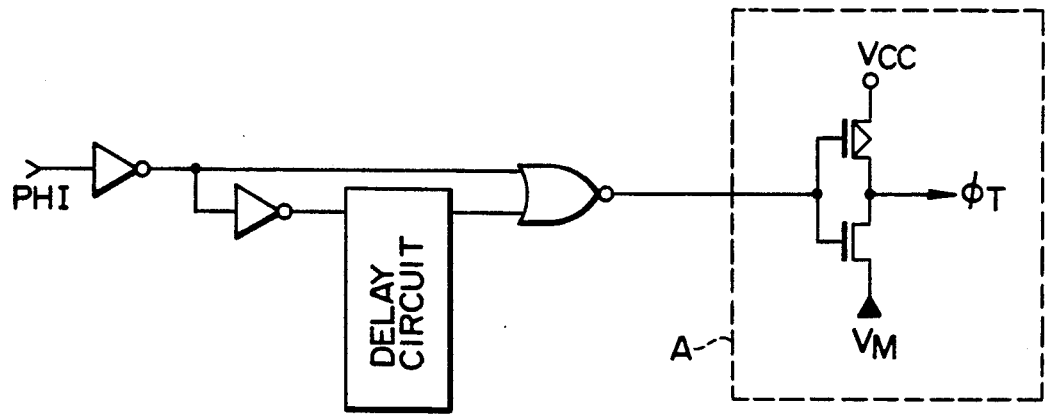
FIG. 5 is a circuit diagram showing a circuit for receiving a signal PHI generated by the circuit shown in FIGS. 3 and 4 and generating a charge transfer transistor drive signal $\phi_T$.
Figure 6:
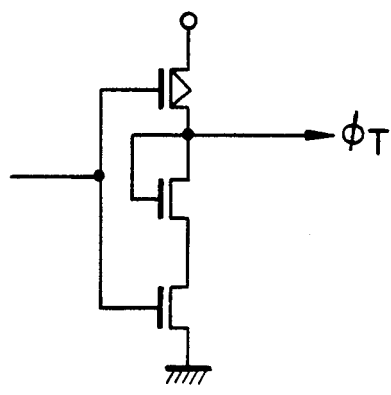
FIGS. 6 to 9 are circuit diagrams showing modifications of an output portion A shown in FIG. 5, respectively.
Figure 7:
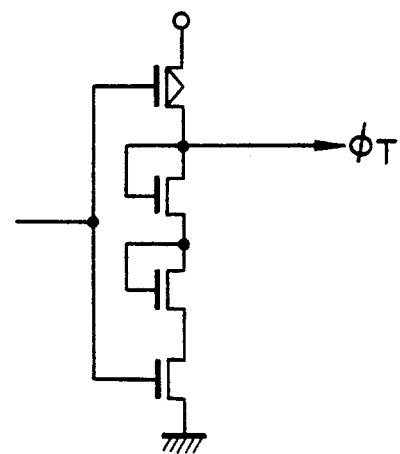
Figure 8:
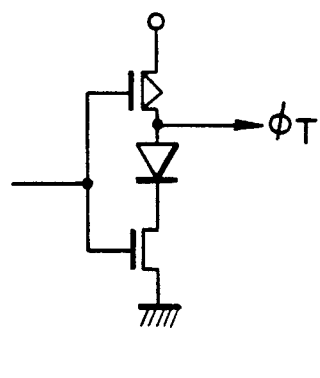
Figure 9:
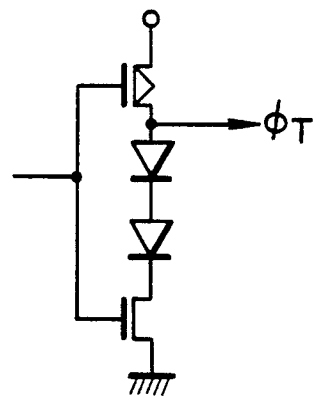

FIG. 1 shows an embodiment of a DRAM of the present invention. A circuit arrangement of the DRAM of this embodiment is the same as that of the conventional DRAM of a charge transfer transistor driving system as described above with reference to FIG. 2 except that a driving potential level of a charge transfer transistor drive signal $\phi_T$ of this DRAM is different from that of the conventional DRAM, and a detailed description thereof will be omitted. FIGS. 3 and 4 are circuit diagrams showing a circuit for generating an n-channel sense amplifier enable signal $\overline{SAN}$, and FIG. 5 is circuit diagram showing a circuit for receiving a signal PHI generated by the circuit shown in FIGS. 3 and 4 and generating a charge transfer transistor drive signal $\phi_T$. FIGS. 6 to 9 show modifications of an output portion A shown in FIG. 5.

That is, the level of the charge transfer transistor drive signal $\phi_T$ is decreased not to a $V_{SS}$ potential (0 V) but to a medium potential VM when charge transfer transistors $NT_1$ and $NT_2$ are to be turned off and is increased to a potential $V_{CC}$ when the transistors $NT_1$ and $NT_2$ are to be turned on. Assuming that a bit line precharge potential is $V_{BL}$ and a threshold potential of the transistors $NT_1$ and $NT_2$ is $V_{TN}$, the medium potential $V_M$ satisfies $V_{TM} \leq V_M \leq V_{BL} + V_{TN}$ and is set to be, e.g., $V_{CC}/2 = 2.5$ V.

Figure 10:
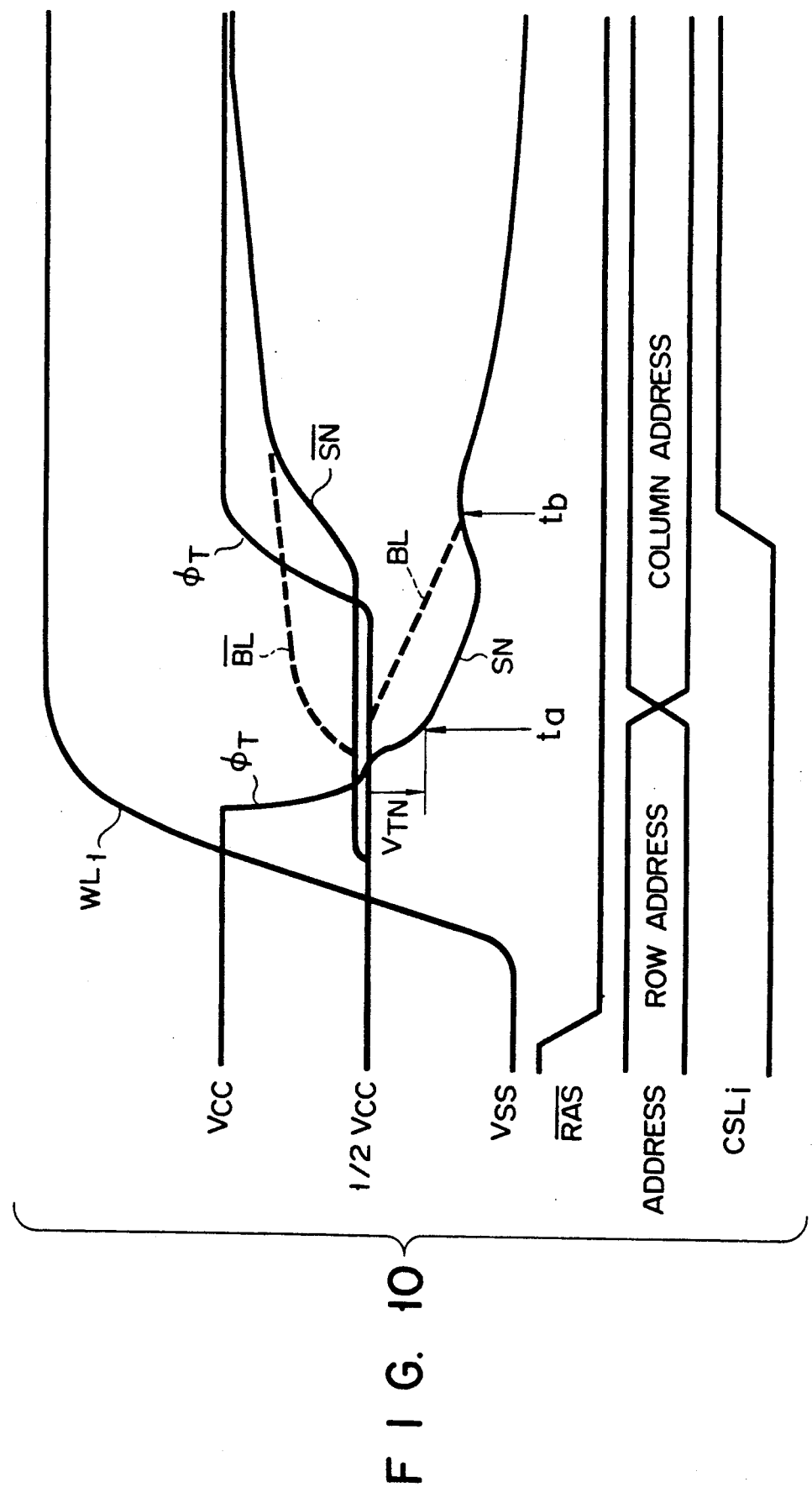
FIG. 10 is a timing chart showing waveforms for explaining an operation of a dynamic type random-access memory according to the present invention.

An operation of the above DRAM will be described below with reference to waveforms shown in FIG. 10. Assuming that data indicating potential of 0 V ("L" level) is written in a memory cell $MC_1$ connected to one of bit lines, e.g., a first bit line BL, read and rewrite operations performed for the memory cell $MC_1$ will be described. Since this DRAM adopts a system of precharging the bit line pair to a voltage represented by $V_{BL} = V_{CC}/2 = 2.5$ V, both of the first and second bit lines BL and $\overline{BL}$ are equally kept at 2.5 V before a word line is selected. Row and column addresses are sequentially input as address inputs, and a row address strobe signal $\overline{RAS}$ is enabled after the row address is input, thereby decoding the row address. A word line $WL_1$ at the bit line BL side is selected to turn on the charge transfer transistor TM of the selected memory cell $MC_1$, and the data of 0 V ("L" level) is read out from a capacitor $C_1$ of the memory cell $MC_1$. Therefore, a potential of the first bit line BL is slightly reduced from $V_{CC}/2$.

At the same time the word line $WL_1$ at the first bit line BL side is selected, the dummy word line $DWL_0$ at the second bit line $\overline{BL}$ side is selected to turn on the charge transfer transistor TD of the dummy cell $DC_0$. In this case, a potential of $V_{DC}$ (e.g., $V_{CC}/2$) is prewritten in the dummy cell $DC_0$. Therefore, even if the charge transfer transistor TD is turned on to short-circuit a capacitor $C_0$ and the second bit line $\overline{BL}$, a potential of the second bit line $\overline{BL}$ is kept at $V_{CC}/2$ because the capacitor $C_0$ and the second bit line $\overline{BL}$ are at the same potential.

Thereafter, when a small potential difference is produced between the potentials of the first and second bit lines BL and $\overline{BL}$, the signal $\phi_T$ goes to the medium potential $V_M$, the charge transfer transistors $NT_1$ and $NT_2$ are turned off, and the bit lines BL and $\overline{BL}$ are disconnected from the bit line sense amplifier NA. A signal $\overline{SAN}$ goes to the ground potential $V_{SS}$ to enable the n-channel sense amplifier NA, and a signal SAP goes to the potential $V_{CC}$ to enable the p-channel sense amplifier PA. As a result, a small potential difference between the pair of sense nodes SN and $\overline{SN}$ of the sense amplifier NA is sense-amplified, and a potential of the sense node SN is reduced to 0 V. In addition, the potential of the bit line $\overline{BL}$ is increased to the potential $V_{CC}$ side by the p-channel sense amplifier PA.

When the potential of the first sense node SN is decreased to be smaller than $(V_{CC}/2) - V_{TN}$ (i.e., the potential difference between the potential of the first sense node SN and the level of the signal $\phi_T$ is increased to be larger than $V_{TN}$), an impedance of the charge transfer transistor $NT_1$ is gradually decreased in accordance with the potential difference between the two terminals. Therefore, the n-channel sense amplifier NA starts reducing the charge of the first bit line BL, and the potential of the first bit line BL is decreased. As a result, the charge of the first bit line BL starts flowing into the first sense node SN to abruptly reduce a potential decreased speed of the first sense node SN. After a time ta, the potentials of the first sense node SN and the first bit line BL are gradually reduced to be close to each other and finally reach 0 V. Therefore, the potential of the first bit line is rewritten in the selected memory cell $MC_1$, and the potential of the second bit line $\overline{BL}$ is rewritten in the dummy cell $DC_0$.

After the time ta, a signal $\overline{CAS}$ is enabled to decode the column address, and the column selection transistors $CT_1$ and $CT_2$ are turned by a column decode signal $CSL_i$. As a result, the potentials of the pair of sense nodes SN and $\overline{SN}$ of the n-channel sense amplifier NA are reamplified by the data buffer DQB via the data lines $BQ_1$ and $DQ_2$ and output from a pair of data buses $DL_1$ and $DL_2$, respectively.

Before (or after) the above rewrite operation is finished, the signal $\phi_T$ is returned to the potential $V_{CC}$ to turn on the charge transfer transistors $NT_1$ and $NT_2$.

When the transistor $NT_1$ is turned on, potential redistribution is abruptly performed between the first sense node SN and the first bit line BL, and the potential of the first sense node SN having a smaller capacitance is slightly increased. Since, however, the potentials of the first sense node SN and the first bit line BL are already close to each other, the potential of the first sense node SN is not so abruptly, largely increased.

After the rewrite operation is finished as described above, the word line $WL_1$ and the dummy word line $DWL_0$ return to a nonselection state. Thereafter, a bit line precharge dummy cell write signal $\overline{EQL}$ goes to the potential $V_{CC}$ to precharge the bit lines BL and $\overline{BL}$ to $V_{BL}$ and dummy cells $DC_0$ and $DC_1$ to a potential $V_{DC}$.

In the above read operation of the DRAM, the capacitances of the bit lines BL and $\overline{BL}$ are completely disconnected upon the sense operation performed by the n-channel sense amplifier NA. Therefore, loads on the sense nodes SN and $\overline{SN}$ are reduced to increase a speed of sense amplification.

In addition, at the time ta at which the charge of the first bit line BL starts flowing into the first sense node SN to rapidly reduce the potential decrease speed of the first sense node SN, the potential difference between the pair of sense nodes SN and $\overline{SN}$ is larger than $V_{TN}$. Therefore, even if the column selection transistors $CT_1$ and $CT_2$ are turned on in this state, the potential difference between the sense nodes SN and $\overline{SN}$ is large enough to be reamplified by the data buffer DQB via the data lines DQ and $\overline{DQ}$, respectively, thereby realizing high-speed access.

Even if the column selection transistors $CT_1$ and $CT_2$ are turned on at a time tb at which the potential of the first sense node SN is slightly increased, the power of the n-channel sense amplifier NA is not reduced. Therefore, the charge of the data line $DQ_1$ can be extracted at a satisfactorily high speed to eliminate an erroneous operation caused by the data buffer DQB.

According to the above DRAM, therefore, even if a time $t_{RAD}$ from an enable timing of the signal $\overline{RAS}$ to an input timing of a column address is shorter or longer than or falls within a predetermined range, the potentials of the sense nodes SN and $\overline{SN}$ of the n-channel sense amplifier NA have almost no increase when the signal $\overline{CAS}$ is enabled after the column address is input. Therefore, the data buffer DQB can correctly perform reamplification.

In the above embodiment, the potentials are set to satisfy the relation of $V_{TN} \leq V_M \leq V_{BL} + V_{TN}$. The same effects as those of the above embodiment, however, can be obtained by turning off the charge transfer transistors $NT_1$ and $NT_2$ in an initial stage of the sense operation by the sense amplifier NA and turning on the transistors $NT_1$ and $NT_2$ before the sense amplifier NA completes the sense operation. Therefore, assuming that a voltage required to turn on the column selection transistors $CT_1$ and $CT_2$ to allow the data buffer DQB to perform the sense operation is $\alpha$ and a potential at which the sense node SN or $\overline{SN}$ starts decreasing the charge of the bit line BL or $\overline{BL}$, respectively, is $\beta$, a relation of $V_{TN} + \beta \geq V_M \geq B_{BL} + V_{TN} - \alpha$ need only a set.

Figure 11:
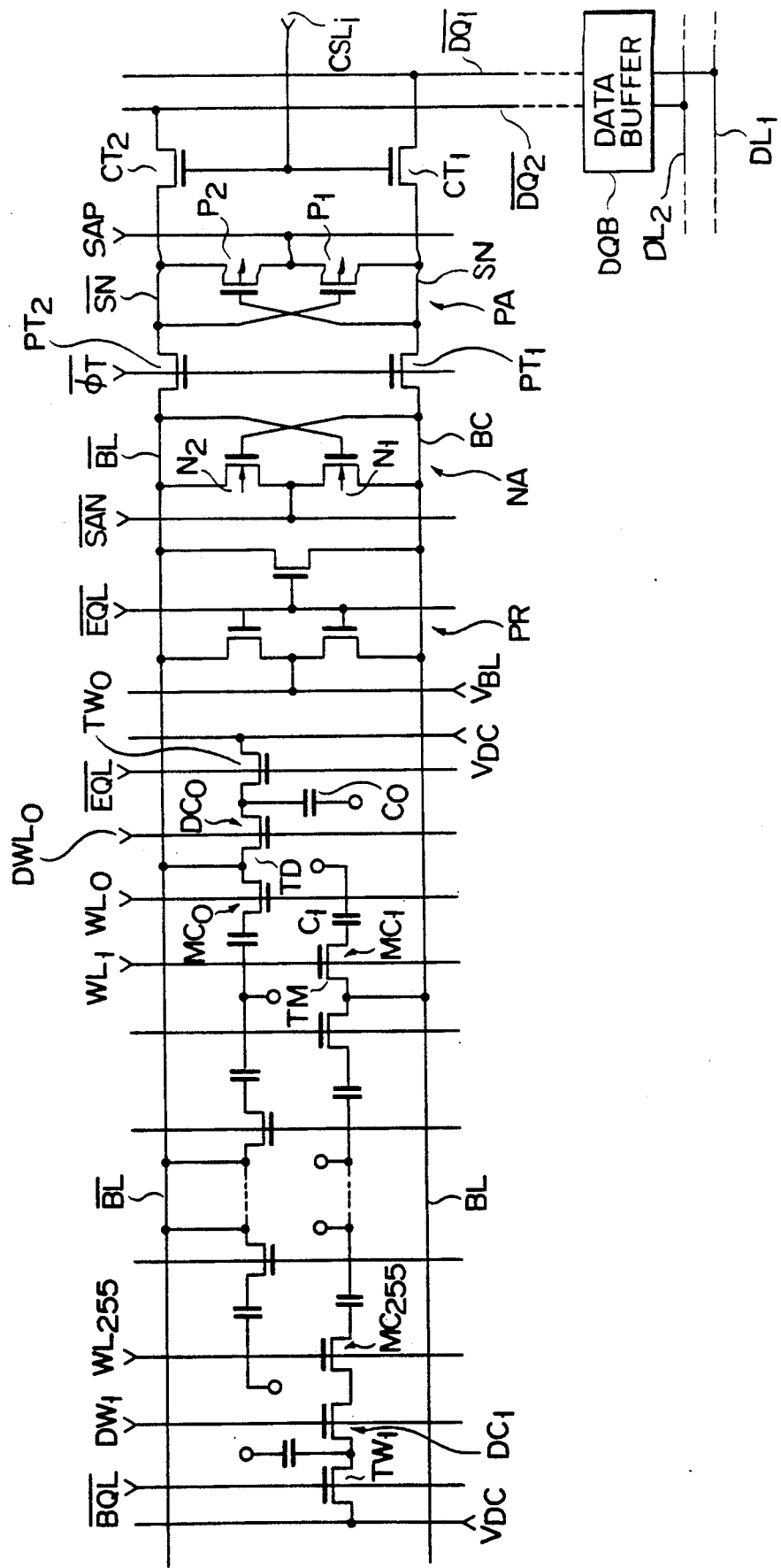
FIG. 11 is a circuit diagram showing a modification of the dynamic type random-access memory according to the present invention.

FIG. 11 shows a part of a DRAM according to another embodiment of the present invention. This embodiment is the same as the above embodiment except that the positions of an n-channel sense amplifier NA and a p-channel sense amplifier PA are switched, p-channel charge transfer transistors $PT_1$ and $PT_2$ are used in place of the n-channel charge transfer transistors $NT_1$ and $NT_2$, and a logic level of a charge transfer transistor drive signal $\phi T$ is inverted. Therefore, in FIG. 11, the same reference numerals as in FIG. 1 denote the same parts.

The level of the charge transfer transistor drive signal $\phi T$ is increased not to a potential $V_{CC}$ but to a medium potential $V_M$ when the charge transfer transistors $PT_1$ and $PT_2$ are to be turned off and is decreased to a potential $V_{SS}$ when the transistors $PT_1$ and $PT_2$ are to be turned on. Assuming that a bit line precharge potential is $V_{BL}$ and a threshold voltage of the p-channel charge transfer transistor $PT_1$ and $PT_2$ is $V_{TP}$, the medium potential $V_M$ satisfies a relation of $V_{BL} - |V_{TP}| \leq V_M \leq V_{CC} - |V_{TP}|$.

Figure 12:
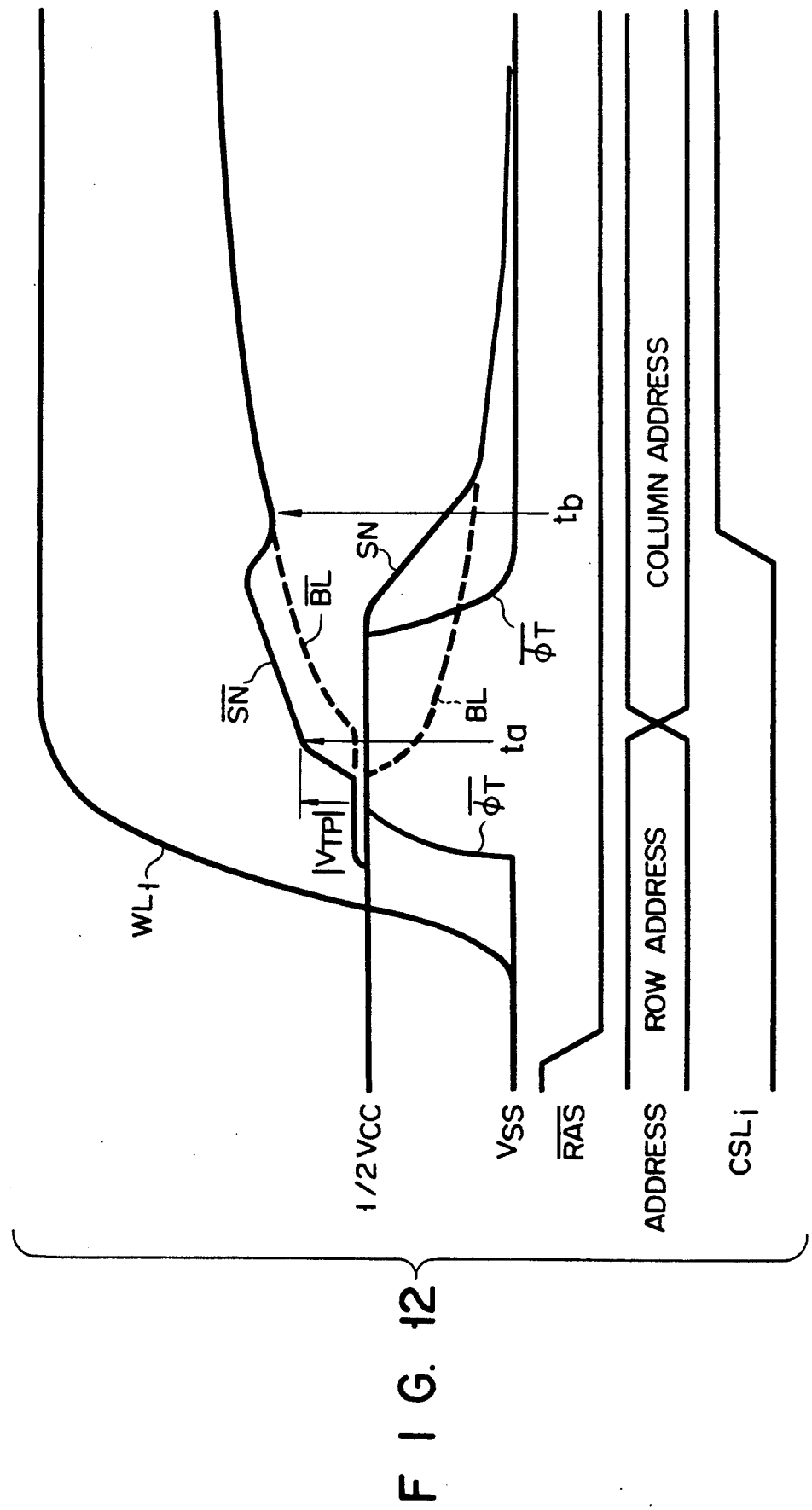
FIG. 12 is a timing charge showing waveforms for explaining a operation of the random-access memory shown in FIG. 11.

An operation of the DRAM shown in FIG. 11 is similar to that of the above embodiment and performed as shown in the timing charge of FIG. 12 to obtain the same effects as those of the above embodiment. That is, at a time ta at which a charge starts flowing from the second sense node $\overline{SN}$ to the second bit line $\overline{BL}$ to abruptly reduce a potential increase speed of the second sense node SN, a potential difference between a pair of sense nodes SN and $\overline{SN}$ is larger than $|VTP|$. Therefore, even if column selection transistors $CT_1$ and $CT_2$ are turned on in this state, the potential difference between the sense nodes SN and $\overline{SN}$ is large enough to be reamplified by a data buffer DQB via data lines $DQ_1$ and $DQ_2$, respectively, thereby realizing high-speed access.

When the charge transfer transistor $PT_2$ is turned on, charge redistribution is abruptly performed between the second sense node $\overline{SN}$ and the second bit line $\overline{BL}$, and the potential of the second sense node $\overline{SN}$ having a smaller capacitance is slightly decreased. Even if the column selection transistors $CT_1$ and $CT_2$ are turned on at a time tb at which the potential of the node SN is decreased, a decrease in amplification power of the p-channel sense amplifier PA is small enough to eliminate an erroneous operation caused by the data buffer DQB.

In the above embodiment shown in FIG. 11, the potentials satisfy the relation of $V_{BL} - |V_{Tp}| \leq V_M \leq V_{CC} - |V_{tp}|$. The same effects as those of the above embodiment, however, can be obtained by turning off the charge transfer transistors $PT_1$ and $PT_2$ in an initial stage of the sense operation performed by the sense amplifier PA and turning on the transistors $PT_1$ and $PT_2$ before the sense amplifier PA completes the sense operation. Therefore, assuming that a voltage required to turn on the column selection transistors $CT_1$ and $CT_2$ to allow the data buffer DQB to perform the sense operation is $\alpha$ and a charge at which the sense node SN or $\overline{SN}$ starts decreasing the charge of the bit line BL or $\overline{BL}$, respectively, is $\beta$, a relation of $V_{BL} - |V_{TP}| + \alpha \leq V_M \leq V_{CC} - |V_{TP}| - \beta$ need only be set.

In the above embodiment shown in FIG. 1 or 11, not only the charge transfer transistors $NT_1$ and $NT_2$ or $PT_1$ and $PT_2$ but also another charge transfer circuit having characteristics equal to those of the charge transfer transistor can be connected between the pair of bit lines BL and $\overline{BL}$ and the pair of sense nodes SN and $\overline{SN}$.

That is, in this charge transfer circuit, similar to the above charge transfer transistor, an element, having an impedance which changes in accordance with a potential difference between two terminals and being turned off in accordance with a potential difference between a third terminal and one of the two terminals, is connected between a terminal at a bit line side and a terminal at a bit line sense amplifier side, and is temporarily turned off when a small potential difference is produced between the bit lines BL and $\overline{BL}$. This element is turned off in an initial stage of enabling of the bit line sense amplifier to disconnect the sense nodes SN and $\overline{SN}$ from the bit line BL and $\overline{BL}$. When a potential difference of a predetermined value or more is obtained between the sense nodes SN and $\overline{SN}$, the impedance of the element is gradually decreased to slowly, naturally connect the sense nodes to the bit lines. Therefore, the speed of the sense operation can be increased, and a temporary reduction in potential difference between the sense nodes SN and $\overline{SN}$ caused when the charge transfer circuit is turned on can be prevented.

FIGS. 13A and 13B show modifications of the above charge transfer circuit. Referring to FIGS. 13A and 13B, a diode D consisting of a bipolar npn transistor in which a collector and a base are connected is connected between two terminals. This diode D is connected in parallel with a switch circuit S, and the switch circuit S is switching-controlled. In this charge transfer circuit, when the switch circuit S is turned off in an initial stage of enabling of the bit line sense amplifier, the diode D is turned off. When a potential difference of a predetermined value or more is produced between the sense nodes SN and $\overline{SN}$, an impedance of the diode D is gradually decreased, and the switch circuit S is turned on when the bit lines BL and $\overline{BL}$ are connected to the sense nodes SN and $\overline{SN}$, respectively.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dynamic type random-access memory comprising:
   a bit line pair constituted by first and second bit lines;
   a memory cell array constituted by a plurality of memory cells connected to said bit line pair;
   a precharge circuit for precharging said bit line pair to a predetermined potential at a predetermined timing;
   a bit line sense amplifier to be enabled after data written in one of said plurality of memory cells is read out to said bit line pair; and
   a charge transfer circuit connected between said bit line pair and first and second sense nodes of said bit line sense amplifier, said dynamic type random-access memory including means for turning off said charge transfer circuit responsive to a reception of a charge transfer drive signal produced when a small potential difference is produced between bit lines of said bit line pair, and including means for decreasing an impedance responsive to a potential difference between said bit line pair and said first and second sense nodes of said bit line sense amplifier being increased when a potential difference between a control terminal and said first and second sense nodes or a potential difference between one of said bit line pair and one of said first and second sense nodes exceeds a threshold value.

2. A memory according to claim 1, wherein said charge transfer circuit includes means for changing an impedance when a potential difference between a first terminal of said first and second bit lines and a second terminal of said first and second nodes changes, and including means for turning off said charge transfer circuit when a potential difference between a third terminal and one of said first and second terminals becomes not less than a predetermined value, and including means for temporarily turning off said charge transfer circuit when a small potential difference is produced between said first and second bit lines when said data is read out from said memory cell.

3. A memory according to claim 1, wherein said charge transfer circuit is a field effect transistor, a predetermined drive signal being supplied to the gate of said field effect transistor.

4. A memory according to claim 1, wherein said field effect transistor is an n-channel MOS transistor, and including means for decreasing the level of a drive signal to be supplied to the gates of said MOS transistor from the power source potential to the medium potential between the power source potential and the ground potential in order to turn off said MOS transistor and including means for increasing the level of said drive signal in order to turn on said MOS transistor.

5. A memory according to claim 1, wherein said field effect transistor is a p-channel MOS transistor, said field effect transistor including means for increasing the level of a drive signal to be supplied to the gate of said MOS transistor from the ground potential to the medium potential between the power source potential and the ground potential in order to turn off said MOS transistor and including means for decreasing the level of said drive signal in order to turn on said MOS transistor.

6. A memory according to claim 1, wherein said charge transfer circuit is constituted by connecting a diode and a switch circuit in parallel with each other, said switch circuit being controlled responsive to the enabling of said bit line sense amplifier.

* * * * *